US009086572B2

(12) United States Patent
Kuhnke

(10) Patent No.: US 9,086,572 B2
(45) Date of Patent: Jul. 21, 2015

(54) CORNER REFLECTOR FOR AN ARMORED VEHICLE

(71) Applicant: Dieter Kuhnke, Luebbecke (DE)

(72) Inventor: Dieter Kuhnke, Luebbecke (DE)

(73) Assignee: GuS Periscopes GmbH & Co. KG, Luebbecke (DE)

( * ) Notice: Subject to any disclaimer, the term of this patent is extended or adjusted under 35 U.S.C. 154(b) by 0 days.

(21) Appl. No.: 14/451,947

(22) Filed: Aug. 5, 2014

(65) Prior Publication Data

US 2015/0168709 A1 Jun. 18, 2015

Related U.S. Application Data

(62) Division of application No. 13/404,194, filed on Feb. 24, 2012, now Pat. No. 8,861,105.

(30) Foreign Application Priority Data

Dec. 15, 2011 (EP) .................... 11009889

(51) Int. Cl.
  *G02B 5/04* (2006.01)
  *G02B 23/08* (2006.01)
  *G02B 23/16* (2006.01)
  *B60R 1/10* (2006.01)
  *H05K 9/00* (2006.01)

(52) U.S. Cl.
  CPC . *G02B 23/08* (2013.01); *B60R 1/10* (2013.01); *G02B 23/16* (2013.01); *H05K 9/0094* (2013.01)

(58) Field of Classification Search
  CPC .................. G02B 5/04; F41H 5/266
  See application file for complete search history.

(56) References Cited

U.S. PATENT DOCUMENTS

| 4,863,789 A | 9/1989 | Arai |
| 5,012,041 A | 4/1991 | Sims et al. |
| 6,172,806 B1 | 1/2001 | Faworski |

(Continued)

FOREIGN PATENT DOCUMENTS

| DE | 4004227 A1 | 8/1991 |
| DE | 202006004545 U1 | 6/2006 |

(Continued)

OTHER PUBLICATIONS

Department of Defense—USA: Military Handbook Grounding, Bonding, and Shielding for Electronic Equipments and Facilities, vol. 1 of 2 Volumes Basic Theory, Dec. 29, 1987 URL:http://everyspec.com/MIL-HDBK-0300-0499/download.php?spec=MIL-HDBK-419A_VOL-1.023447.pdf Found on the Internet Feb. 13, 2015—Part 1 and Part 2.

*Primary Examiner* — Jennifer L. Doak
(74) *Attorney, Agent, or Firm* — Laurence A. Greenberg; Werner H. Stemer; Ralph E. Locher

(57) ABSTRACT

A corner reflector of an armored vehicle includes a housing having a look-in aperture of a subregion extending into a vehicle interior, a look-out aperture of a subregion extending out of the vehicle and at least one prism body or deflection mirrors disposed in the housing, to provide effective shielding against sources of electromagnetic interference. Providing the corner reflector on all sides with a shield made of electrically conductive material ensures that vehicles equipped therewith or individual electronic components thereof cannot be influenced or rendered unusable by sources of electromagnetic interference.

8 Claims, 3 Drawing Sheets

(56) References Cited

U.S. PATENT DOCUMENTS

| | | |
|---|---|---|
| 6,359,681 B1 | 3/2002 | Housand et al. |
| 2004/0129866 A1* | 7/2004 | Mangoubi .................... 250/216 |
| 2009/0017552 A1 | 1/2009 | Lippard et al. |
| 2010/0180428 A1 | 7/2010 | Jones et al. |

FOREIGN PATENT DOCUMENTS

| | | |
|---|---|---|
| WO | 9741460 A2 | 11/1997 |
| WO | 2010102597 A1 | 9/2010 |

* cited by examiner

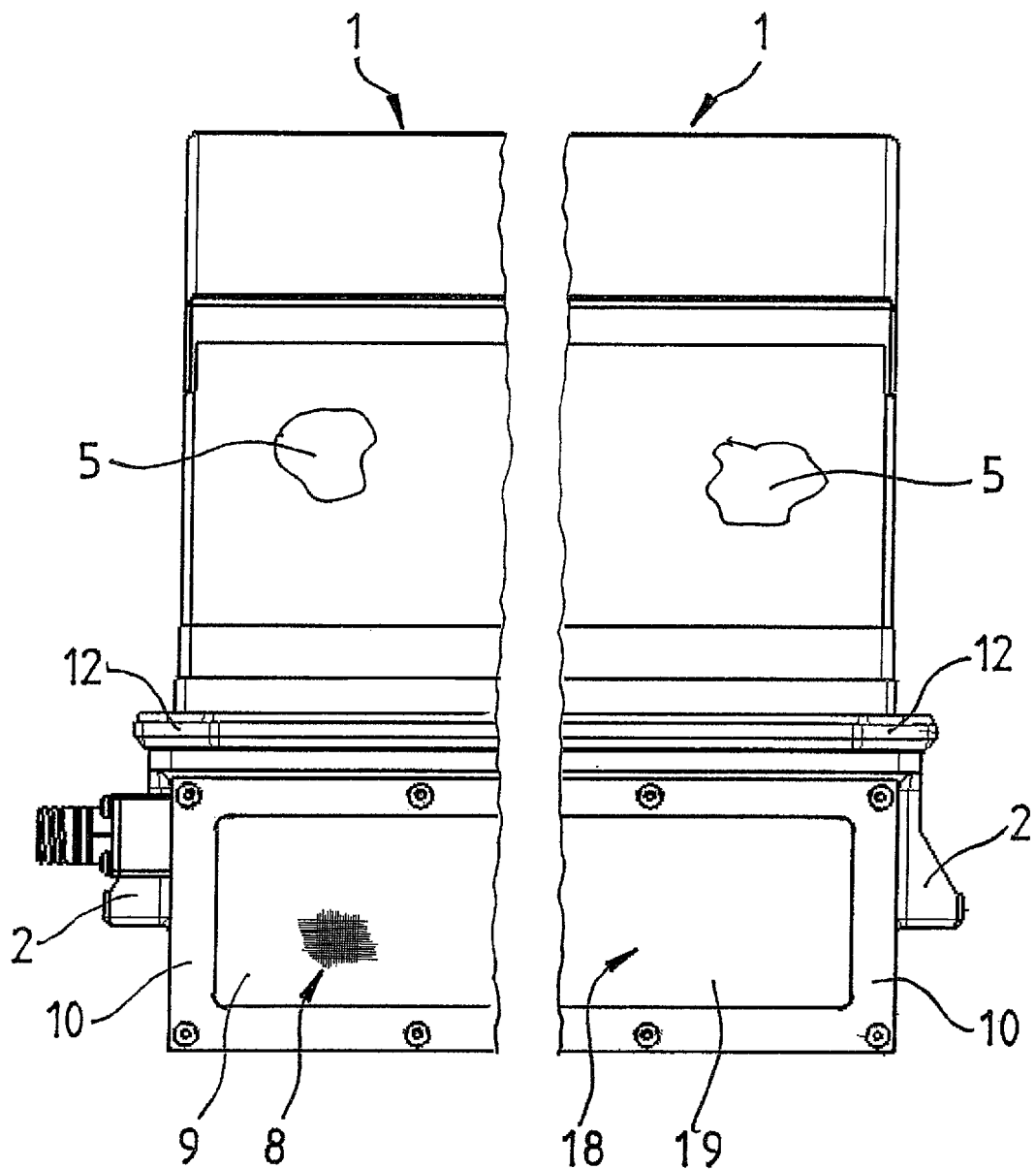

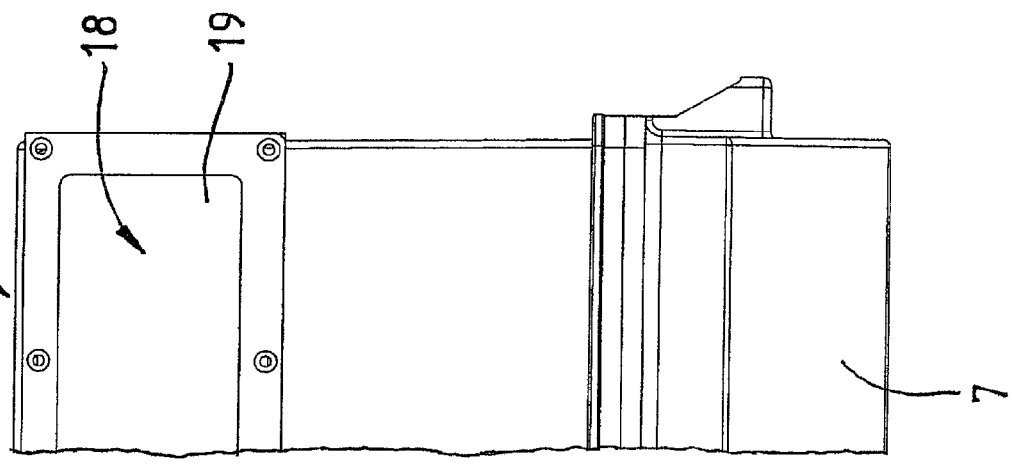
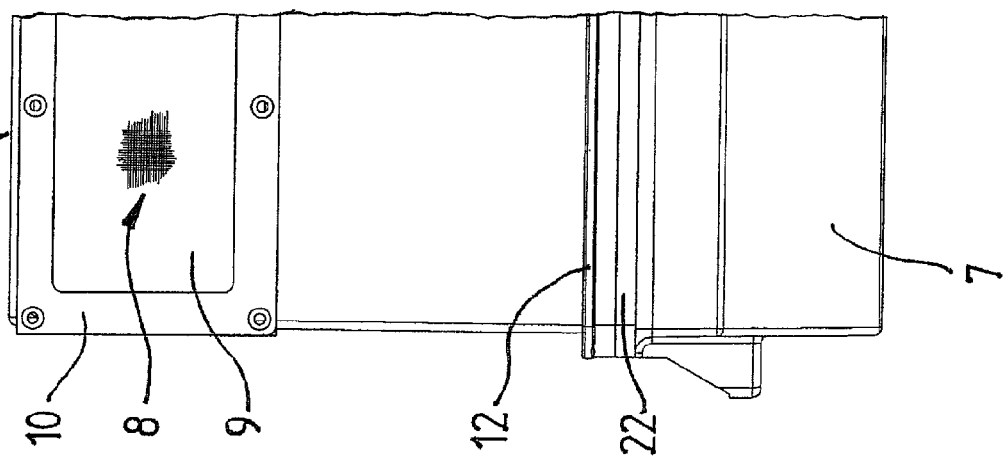
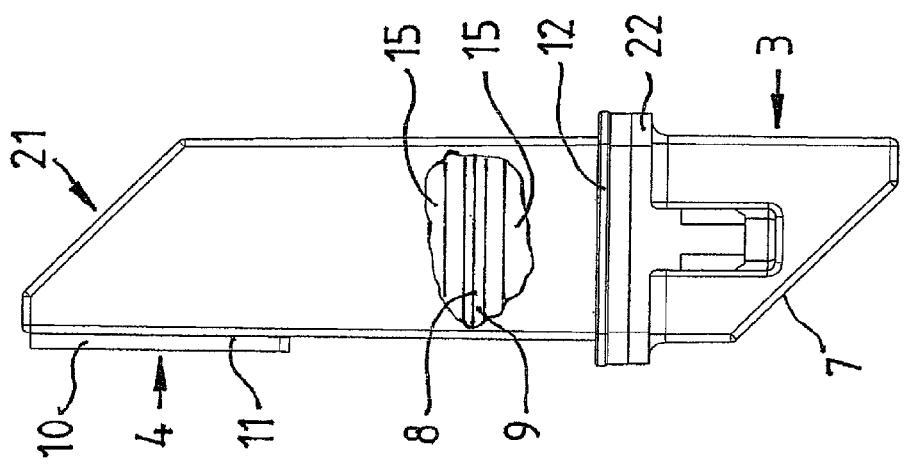

CORNER REFLECTOR FOR AN ARMORED VEHICLE

CROSS-REFERENCE TO RELATED APPLICATION

This is a Divisional of U.S. application Ser. No. 13/404,194, filed Feb. 24, 2012; the application also claims the priority, under 35 U.S.C. §119, of European Patent Application EP 11 009 889.4, filed Dec. 15, 2011; the prior applications are herewith incorporated by reference in their entirety.

BACKGROUND OF THE INVENTION

Field of the Invention

The invention relates to a corner reflector for an armored vehicle, including a housing having a look-in aperture of a subregion extending into a vehicle interior, a look-out aperture of a subregion extending out of the vehicle, and at least one prism body or deflection mirrors disposed in the housing.

A corner reflector for an armored vehicle, which is known from German Utility Model DE 20 2006 004 545 U1, includes a laser beam protection filter for protecting a vehicle driver against glare, in which the driver is located in the vehicle interior and is looking to the outside by way of the corner reflector.

The disadvantage of such a known corner reflector is that it does not protect the vehicle equipped therewith against sources of electromagnetic interference from an attacker, and therefore the vehicle itself or the individual electronic components thereof can become damaged or destroyed.

SUMMARY OF THE INVENTION

It is accordingly an object of the invention to provide a corner reflector for an armored vehicle, which overcomes the hereinafore-mentioned disadvantages of the heretofore-known devices of this general type and which offers effective shielding against sources of electromagnetic interference, thereby ensuring that vehicles equipped therewith, or individual electronic components thereof, cannot be influenced or rendered unusable by sources of electromagnetic interference.

With the foregoing and other objects in view there is provided, in accordance with the invention, a corner reflector for an armored vehicle. The corner reflector comprises a housing having a look-in aperture at a subregion extending into a vehicle interior, a look-out aperture at a subregion extending out of the vehicle, and at least one prism body or deflection mirrors disposed in the housing. A whole-area shield made of electrically conductive material protects the vehicle or electronic components of the vehicle against damage or interference by sources of electromagnetic interference.

It is thereby achieved that sources of electromagnetic interference cannot penetrate the vehicle shell into the armored vehicle, thereby ensuring, in particular, that the function of electronic components cannot become impaired by such sources of interference from an attacker.

In accordance with another advantageous feature of the invention, the electrically conductive material is disposed either in front of the look-in aperture on the subregion directed toward the vehicle interior, or in front of the look-out aperture on the subregion extending out of the vehicle, or in the beam path of the corner reflector, approximately between two separate prism blocks, thereby making it possible to select an optimal position of the shield. One embodiment including a shield disposed in front of the look-out aperture protects electronic components of the corner reflector itself, such as electronic displays, the views of which are reflected into the viewing side.

In accordance with a further advantageous feature of the invention, the corner reflector can be furthermore equipped with a plurality of identical or different electromagnetic shields in order to further improve the shielding effect thereof.

In accordance with a preferred feature of the invention, the shield of the housing is constructed as a netting, which is also known as a mesh fabric or fabric netting, made of superfine, conductive fibers, each of which can be made of a metallic wire that can have a thickness of only 20 to 80 μm, wherein the netting has between 25 and 250, in particular 50 openings per inch, or 10 to 100, in particular 20 openings per cm, and therefore light transmission of more than 85% is retained, but a shielding attenuation of 100 bis 37 db is achieved in a frequency range of 1 MHz to 10 GHz. The shielding attenuation can also be adapted to known sources of electromagnetic interference by varying the wire thicknesses and/or the number of openings.

In accordance with an added, preferable feature of the invention, in order to protect the extremely fine netting, it is pressed between two panes in a composite pane, wherein the panes of the composite pane can be made of glass or plastic, and the netting is either embedded in a melt foil or is hot-pressed between two plastic panes.

In accordance with an additional feature of the invention, in order to produce secure contact of the netting to the housing of the corner reflector, the netting extends circumferentially beyond the edge of the composite pane by way of an edge constructed as a contact edge, and therefore the contact edge has circumferential contact with a conductive frame of the housing, which itself has conductive contact surface with the housing of the corner reflector which itself also establishes a conductive connection to the vehicle shell by way of a conductive seal, thereby ensuring that only the defined openings in the netting influence the whole-area protection of the vehicle shell.

In accordance with a second important embodiment of the corner reflector according to the invention, a pane is equipped with a transparent, electrically conductive coating in the region of the look-in aperture, which itself has electrically conductive contact with the vehicle shell by way of the housing of the corner reflector and a conductive seal, thereby sealing the outer shell of the vehicle entirely against penetrating electromagnetic interference radiation.

In accordance with yet another feature of the invention, the coating can preferably include an indium-tin-oxide layer or so-called ITO coating.

In accordance with yet a further feature of the invention, a seal made of silicone with nickel graphite, which permanently withstands all feasible temperature influences and other environmental influences with great endurance, is used preferably as the conductive seal in this case.

In accordance with yet an added feature of the invention, the surface of the subregion of the housing extending into the interior of an armored vehicle, and/or the surface of the subregion of the housing extending out of the vehicle, is furthermore advantageously equipped with an electrically conductive coating, in such a way that the surfaces of the housing are chromated to improve conductance.

In accordance with an advantageous, concomitant feature of the invention, a further possible variation of the corner reflector provides that if shields are provided in front of the look-in aperture and/or in front of the look-out aperture and/ or in the beam path of the corner reflector, they can be different shields, such as netting having different attenuation or different transparent, electrically conductive coatings, or a combination of such netting and coatings.

Other features which are considered as characteristic for the invention are set forth in the appended claims.

Although the invention is illustrated and described herein as embodied in a corner reflector for an armored vehicle, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIG. 2 is a fragmentary, left-side elevational view of a corner reflector including a netting in front of a look-in aperture thereof;

FIG. 3 is a fragmentary, right-side elevational view of a corner reflector including an electrically conductive coating of a pane of the look-in aperture thereof;

FIG. 4 is a partly broken-away, side-elevational view of a second embodiment of a corner reflector including a netting in front of a look-out aperture thereof and in a beam path;

FIG. 5 is a fragmentary, left-side elevational view of a corner reflector including a netting in front of the look-out aperture thereof; and FIG. 6 is a fragmentary, right-side elevational view of a corner reflector including an electrically conductive coating of a pane in front of the look-out aperture thereof.

DETAILED DESCRIPTION OF THE INVENTION

Figure 1:
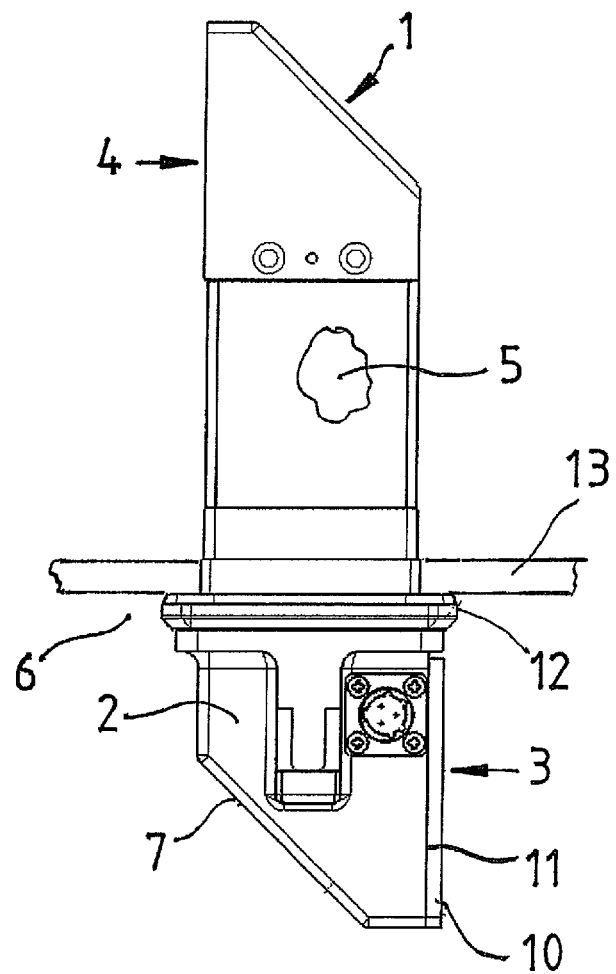
FIG. 1 is a fragmentary, diagrammatic, side-elevational view of a first embodiment of a corner reflector.

Referring now in detail to the figures of the drawings as a whole, there are seen respective first and second embodiments of a corner reflector 1;21 of an armored vehicle, including a housing 2;22 having a look-in aperture 3 of a subregion extending into a vehicle interior 6, a look-out aperture 4 of a subregion extending out of the vehicle and a prism body 5;15 disposed in the housing 2;22. A subregion of the corner reflector 1;21 extending out of the vehicle penetrates a vehicle shell 13 and is sealed by way of a conductive seal 12 which is made of silicone with nickel graphite, for instance.

As is shown in FIGS. 1 and 2, the first embodiment includes a netting 8 made of superfine conductive fibers which is disposed in front of the look-in aperture 3 of the corner reflector 1. The fibers are formed of thin metallic wire and have a thickness of approximately 20 to 80 μm. FIGS. 4 and 5 show that the second embodiment has such a netting 8 in front of the look-out aperture 4 of the corner reflector 21.

A defined number of openings is provided between the fine wires of the netting 8 to permit light to pass through the netting 8. In this case, approximately 25 to 250, in particular 50, openings per inch can be provided, which corresponds to 10 to 100, in particular 20, openings per cm. Therefore, light transmission greater than 85% is possible, thereby permitting a shielding attenuation of 10 to 37 db in a frequency range of 1 MHz to 10 GHz to be achieved.

The netting 8 is pressed between two panes to form a composite pane 9. Therefore, in particular when the panes are made of glass, the netting 8 is embedded in a melt foil. Alternatively, in the case of pure plastic panes, the netting is embedded and hot-pressed between two plastic panes.

The netting 8 extends circumferentially beyond the edge of the composite panes 9 and thereby forms a contact edge which is integrated by way of circumferential contact with a conductive frame 10 which itself has a conductive contact surface 11 with the housing 2;22 of the corner reflector 1;21.

As is shown in FIGS. 3 and 6, another embodiment of the corner reflector 1;21 according to the invention is provided with a pane 19 in the region of the look-in aperture 3 of the housing 1 or in the region of the look-out aperture 4 of the housing 22. The pane 19 is equipped with a transparent, electrically conductive coating 18 which likewise has conductive electric contact with the vehicle shell 13 by way of the housing 2;22 of the corner reflector 1;21 and a conductive seal 12. The transparent, electrically conductive coating 18 is formed by an indium-tin oxide layer (ITO coating) in this case.

As is shown in FIG. 4, the shielding can also be disposed in the beam path of the corner reflector (1; 21), approximately between two separate prism bodies or blocks (15), and can be formed either by a netting 8 or an electrically conductive, transparent coating 18, each having electrical contact with the housing 2;22 and the vehicle shell 13.

A surface 7 of the subregion of the housing 2;22 extending into the interior is likewise coated with an electrically conductive coating, in which the surfaces 7 of the housing 2;22 are chromated to improve conductance.

The invention claimed is:

1. A corner reflector for an armored vehicle, the corner reflector comprising:
   a housing having a look-in aperture at a subregion extending into a vehicle interior, a look-out aperture at a subregion extending out of the vehicle, and at least one prism body or deflection mirrors disposed in said housing;
   a conductive seal formed of silicone with nickel graphite;
   a corner reflector beam path;
   a pane disposed at least one of in a region in front of said look-in aperture or in a region in front of said look-out aperture or in said corner reflector beam path; and
   a shield made of electrically conductive material for protecting the vehicle or electronic components of the vehicle against damage or interference by sources of electromagnetic interference, said shield being formed of a transparent, electrically conductive coating applied to said pane, and said coating making electrically conductive contact with a vehicle shell by way of said housing and said conductive seal.

2. The corner reflector according to claim 1, wherein said shield is one of a plurality of identical or different electromagnetic shields.

3. The corner reflector according to claim 1, wherein said pane is made of glass or plastic.

4. The corner reflector according to claim 1, wherein said coating is an indium-tin oxide or ITO coating.

5. A corner reflector for an armored vehicle, the corner reflector comprising:
   a housing having a look-in aperture at a subregion extending into a vehicle interior, a look-out aperture at a subregion extending out of the vehicle, and at least one prism body or deflection mirrors disposed in said housing;
   a conductive seal;

a corner reflector beam path;

a pane disposed at least one of in a region in front of said look-in aperture or in a region in front of said look-out aperture or in said corner reflector beam path;

a shield made of electrically conductive material for protecting the vehicle or electronic components of the vehicle against damage or interference by sources of electromagnetic interference, said shield being formed of a transparent, electrically conductive coating applied to said pane, and said coating making electrically conductive contact with a vehicle shell by way of said housing and said conductive seal; and an electrically conductive coating disposed on at least one of a surface of said subregion of said housing extending into the vehicle interior or a surface of said subregion of said housing extending out of the vehicle; said electrically conductive coating on said surface of at least one of said subregions of said housing being a chromated coating for improving conductance.

6. The corner reflector according to claim 5, wherein said shield is one of a plurality of identical or different electromagnetic shields.

7. The corner reflector according to claim 5, wherein said pane is made of glass or plastic.

8. The corner reflector according to claim 5, wherein said coating is an indium-tin oxide or ITO coating.

* * * * *